(12) United States Patent
Moriya et al.

(10) Patent No.: US 11,698,422 B2
(45) Date of Patent: Jul. 11, 2023

(54) MAGNETIC SENSOR DEVICE

(71) Applicant: TDK Corporation, Tokyo (JP)

(72) Inventors: Takahiro Moriya, Tokyo (JP);
Toshihiko Oyama, Tokyo (JP); Keiji Suzuki, Tokyo (JP); Toshio Ishikawara, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/828,104

(22) Filed: May 31, 2022

(65) Prior Publication Data
US 2023/0026524 A1    Jan. 26, 2023

(30) Foreign Application Priority Data
Jul. 20, 2021  (JP) .................. 2021-119396

(51) Int. Cl.
*G01R 33/09* (2006.01)
(52) U.S. Cl.
CPC .......... *G01R 33/091* (2013.01); *G01R 33/093* (2013.01); *G01R 33/096* (2013.01); *G01R 33/098* (2013.01)
(58) Field of Classification Search
CPC .. G01R 33/091; G01R 33/093; G01R 33/096; G01R 33/098
See application file for complete search history.

(56) References Cited

U.S. PATENT DOCUMENTS

| 2009/0001971 A1 | 1/2009 | Racz et al. |
| 2011/0133724 A1 | 6/2011 | Fukuoka et al. |
| 2021/0293907 A1* | 9/2021 | Lassalle-Balier .... G01R 33/091 |

FOREIGN PATENT DOCUMENTS

| JP | 2009-14716 A | 1/2009 |
| JP | 2011-137796 A | 7/2011 |

* cited by examiner

*Primary Examiner* — Alesa Allgood
(74) *Attorney, Agent, or Firm* — Posz Law Group, PLC

(57) ABSTRACT

A magnetic sensor device for detecting linear movement of a moving body includes a magnetic field generation unit and a magnetic field detection unit, which is provided to be capable of detecting the magnetic field generated by the magnetic field generation unit. The magnetic field detection unit is provided to be relatively moveable along a first axis accompanying linear movement of the moving body. The first axis is parallel to the direction of movement of the moving body. The magnetic field generation unit includes a first magnetic field generation unit and a second magnetic field generation unit. The first magnetic field generation unit and the second magnetic field generation unit are arranged substantially parallel to the first axis. A first line segment parallel to a first magnetization direction of the first magnetic field generation unit is inclined with respect to a second axis orthogonal to the first axis. A second line segment parallel to a second magnetization direction of the second magnetic field generation unit is inclined with respect to the second axis. The first line segment and the second line segment are positioned symmetrically with respect to the second axis and intersect each other to open toward the first axis.

11 Claims, 11 Drawing Sheets

MAGNETIC SENSOR DEVICE

TECHNICAL FIELD

The present invention relates to a magnetic sensor device.

BACKGROUND

In recent years, physical quantity detection devices (position detection devices) for detecting physical quantities (for example, a position or a movement amount (change amount) due to linear movement of a moving body) have been used in various applications. For example, position detection devices are used to detect the position of a clutch or the like in an automobile transmission or to detect the amount of depression of various pedals. As this physical quantity detection device, a magnetic sensor device has been known that is provided with a magnetic sensor capable of detecting a change in an external magnetic field and a magnetic field generation unit (for example, a magnet) capable of changing position relative to the magnetic sensor. In the magnetic sensor device, a sensor signal corresponding to change in the external magnetic field is output from a magnetic sensor.

As the magnetic sensor, one has been known in which a magnetic sensor element that detects a magnetic field to be detected is provided on a substrate. As such a magnetic sensor element, a magnetoresistive effect element (GMR element, TMR element, or the like) in which resistance changes in accordance with changes in an external magnetic field, or the like, has been used.

As shown in FIG. 19, a magnetic sensor device 100 for detecting the position, the movement amount, or the like, due to the linear movement of a moving body is, for example, provided with a magnetic sensor 120 including a magnetic sensor element, and two magnets 130 and 130 as a magnetic field generation unit. When the two magnets 130 and 130, which are parallel to each other along the direction of movement of the moving body, move together with the moving body, the positions of the two magnets 130 and 130 are displaced relative to the magnetic sensor 120. As a result, the magnetic flux generated from the two magnets 130 and 130 and input into the magnetic sensor 120 changes, so that the position and the movement amount of the moving body can be detected.

PATENT LITERATURE

Japan Patent No. 5116576

In the magnetic sensor device 100, the two magnets 130 and 130, which are parallel to each other along the movement direction of the moving body, are positioned with predetermined spacing with their N poles and S poles mutually opposite each other when viewed along the movement direction. In the magnetic sensor device 100, a range (detectable range) that can be detected by the magnetic sensor 120 is determined for a region (magnetic field generation unit region) occupied by the two magnets 130 and 130 arranged in parallel along the movement direction.

In the magnetic sensor device 100, since the magnetizing directions (magnetization directions) of the two magnets 130 and 130 are orthogonal to the movement direction of the moving body, in order to enlarge the detectable range, the distance between the two magnets 130 and 130 must be widened and the magnetic field generation unit region must be made relatively large. As a result, although the detectable range can be increased, the magnetic sensor device 100 also becomes relatively large. What is required is to relatively increase the detectable range while reducing the size of the magnetic sensor device 100 by making the magnetic field generation unit region relatively small.

In view of the above problems, it is an object of the present invention to provide a magnetic sensor device that can be made relatively small while relatively increasing the range detectable by the magnetic sensor.

SUMMARY

In order to resolve the above-described problems, the present invention provides a magnetic sensor device for detecting linear movement of a moving body, the magnetic sensor device comprising a magnetic field generation unit and a magnetic field detection unit provided to be capable of detecting the magnetic field generated by the magnetic field generation unit. The magnetic field detection unit is provided to be relatively moveable along a first axis accompanying linear movement of the moving body. The first axis is parallel to the direction of movement of the moving body; the magnetic field generation unit includes a first magnetic field generation unit and a second magnetic field generation unit. The first magnetic field generation unit and the second magnetic field generation unit are arranged substantially parallel to the first axis. A first line segment parallel to a first magnetization direction of the first magnetic field generation unit is inclined with respect to a second axis orthogonal to the first axis. A second line segment parallel to a second magnetization direction of the second magnetic field generation unit is inclined with respect to the second axis. The first line segment and the second line segment are positioned symmetrically with respect to the second axis and intersect each other to open toward the first axis.

In the above-described magnetic sensor device, in a plan view, each of the first magnetic field generation unit and the second magnetic field generation unit may have an approximately rectangular shape including a first side and a second side opposite each other and a third side and a fourth side opposite each other, with the first side and the second side substantially parallel to the first axis, and the third side and the fourth side substantially parallel to the second axis. In addition, in the above-described magnetic sensor device, in a plan view, the first magnetic field generation unit and the second magnetic field generation unit may each have a quadrangular shape including a first side and a second side opposite each other and a third side and a fourth side opposite each other, with at least one out of the first side and the second side inclined with respect to the first axis, and the third side and the fourth side substantially parallel to the second axis. The quadrangular shape may be a parallelogram shape or a trapezoidal shape.

In the above-described magnetic sensor device, the first line segment and the second line segment may be inclined at an angle of 45° or less with respect to the second axis, and the inclination angle of the first line segment with respect to the second axis and the inclination angle of the second line segment with respect to the second axis may be substantially the same.

In the above-described magnetic sensor device, a first yoke unit connected to the first magnetic field generation unit and a second yoke unit connected to the second magnetic field generation unit may further be provided, and the first yoke unit and the second yoke unit may be connected to each other. The magnetic field detection unit may include a magnetic field detection element, and as the magnetic field detection element, an AMR element, a GMR element or a TMR element can be used.

In addition, the present invention can provide a pedal operating mechanism equipped with the above-described magnetic sensor device.

With the present invention, it is possible to provide a magnetic sensor device that can be made relatively small while relatively increasing the range detectable by the magnetic sensor.

DESCRIPTION

An embodiment of the present invention will be described with reference to the drawings.

In the magnetic sensor device of the present embodiment, "X direction and Y direction" are specified in some drawings as necessary. Here, the X direction is a direction parallel to a first axis AX1 and is parallel to the movement direction of the moving body, and the Y direction is a direction parallel to a second axis AX2 and is a direction orthogonal to the movement direction of the moving body.

Figure 1:
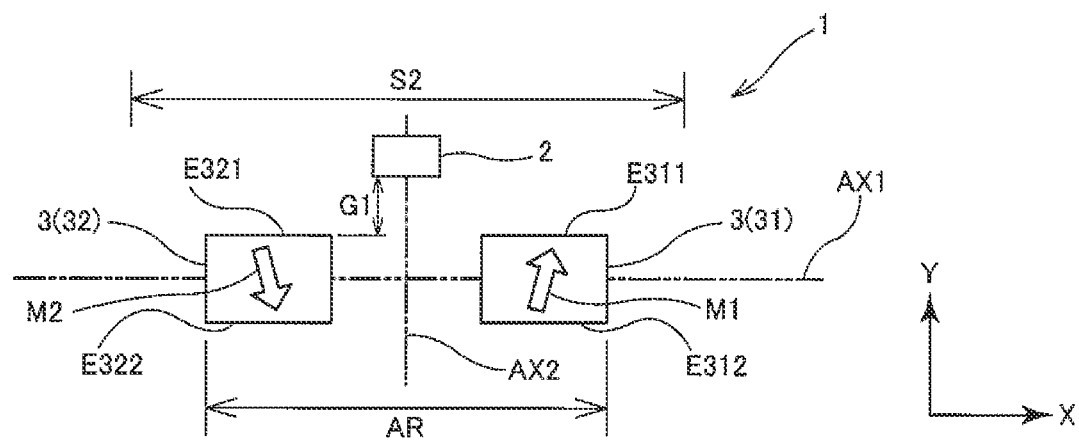
FIG. 1 is a plan view showing a schematic configuration of a magnetic sensor device according to an embodiment of the present invention.
Figure 2:
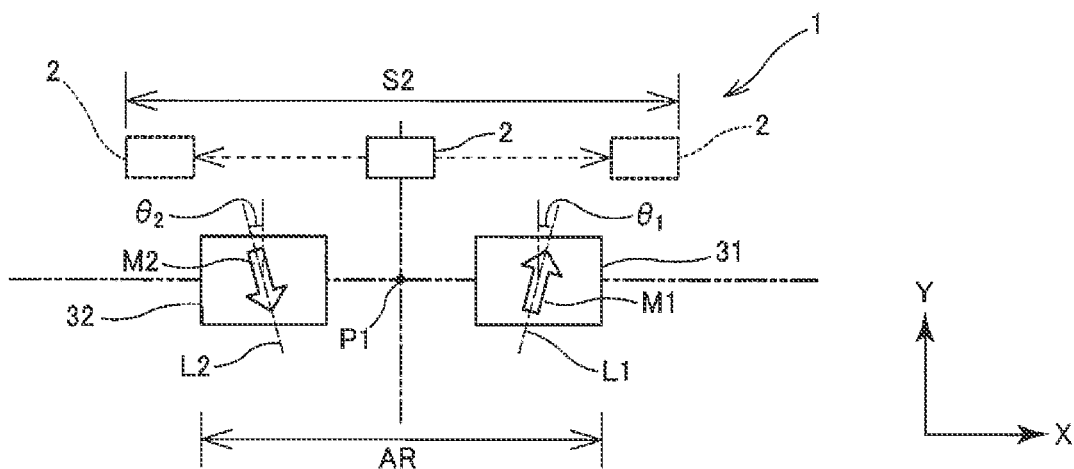
FIG. 2 is a plan view showing a schematic configuration of a magnetic sensor device according to an embodiment of the present invention.
Figure 3:
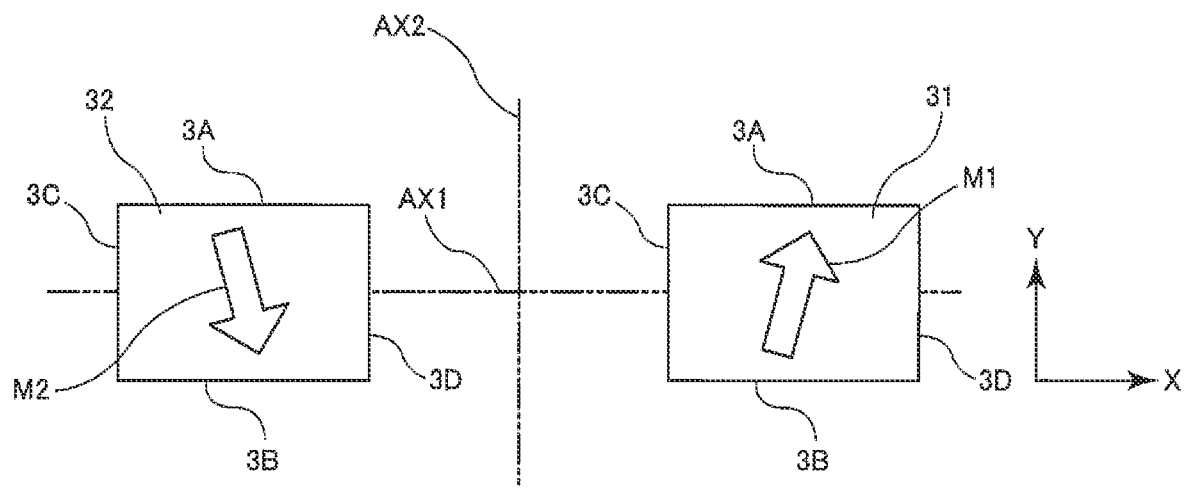
FIG. 3 is a plan view showing a schematic configuration of a magnetic field generation unit in an embodiment of the present invention.

As shown in FIG. 1 to FIG. 3, a magnetic sensor device 1 according to the present embodiment has a magnetic sensor 2, as a magnetic field detection unit, and a magnetic field generation unit 3 that moves in the ±X direction along the first axis AX1 together with a moving body. The magnetic sensor device 1 according to the present embodiment can be used as a stroke sensor for detecting the amount of movement of the moving body in the ±X direction. The magnetic field generation unit 3 includes a first magnet 31 as a first magnetic field generation unit and a second magnet 32 as a second magnetic field generation unit. The first magnet 31 and the second magnet 32 are substantially parallel to the first axis AX1 and are parallel to each other at a predetermined interval G1. In the present embodiment, a region AR between the +X-side end of the first magnet 31 and the −X-side end of the second magnet 32 (the region interposed between both ends along the first axis AX1) is referred to as a "magnetic field generation unit region".

The plan view shape of the first magnet 31 and the second magnet 32 can be substantially rectangular. The substantially rectangular shape includes a first side 3A and a second side 3B, which are substantially parallel to the first axis AX1, and a third side 3C and a fourth side 3D, which are substantially parallel to the second axis AX2. Here, "substantially parallel" means that the angle formed by the first side 3A and the second side 3B with respect to the first axis AX1 and the angle formed by the third side 3C and the fourth side 3D with respect to the second axis AX2 is within the range of 85° to 95°. Further, the substantially rectangular shape means that the angles of all the corners of the plan view quadrangle are within the range of 85° to 95°. That is, the first magnet 31 and the second magnet 32 can be substantially rectangular.

Of the two ends of the first magnet 31 along the second axis AX2, a first end E311, which is located near the magnetic sensor 2, is magnetized to the N pole, and a second end E312, which is located far from the magnetic sensor 2, is magnetized to the S pole. On the other hand, of the two ends of the second magnet 32 along the second axis AX2, a first end E321, which is located near the magnetic sensor 2, is magnetized to the S pole, and a second end E322, which is located far from the magnetic sensor 2, is magnetized to the N pole. That is, when viewed along the first axis AX1 which is the movement direction (±X direction) of the moving body, the first magnet 31 and the second magnet 32 are arranged in parallel so that mutually different magnetic poles face each other. In the first magnet 31 and the second magnet 32, which are arranged in parallel in this way, magnetic field lines from the N pole located at the first end E311 of the first magnet 31 toward the S pole located at the first end E321 of the second magnet 32 (heading toward the −X direction), magnetic field lines heading toward the +X side from the N pole located at the first end E311 of the first magnet 31, and magnetic field lines heading from the −X side toward the S pole located at the first end E321 of the second magnet 32 are formed.

A first line segment L1, which is parallel to the magnetization direction M1 of the first magnet 31, is inclined at a predetermined angle θ1 with respect to the second axis AX2. Similarly, a second line segment L2, which is parallel to the magnetization direction M2 of the second magnet 32, is inclined at a predetermined angle θ2 with respect to the second axis AX2. Further, the first line segment L1 and the second line segment L2, which are inclined in opposite directions, intersect each other to open toward the first axis AX1 (+Y side). By having the first line segment L1 and the second line segment L2 intersect each other to open toward the first axis AX1 (+Y side) in this way, the detectable range S2 can be made larger than the magnetic field generation unit region AR, as will be clear from examples described later. As will be described later, the magnetic sensor device 1 according to the present embodiment generates a detected value θB representing the angle of the magnetic field impressed on the magnetic sensor 2 with respect to the first axis AX1. The range in which the angle as the detected value θB is at least 0° and less than 360°, that is, the range in which the magnetic sensor 2 can move relative to the magnetic field generation unit 3 in the ±X direction is defined as the detectable range S2 in the present embodiment.

The inclination angle θ1 of the first line segment L1 with respect to the second axis AX2 can be 45° or less. Similarly, the inclination angle θ2 of the second line segment L2 with respect to the second axis AX2 can be 45° or less. When the inclination angles θ1 and θ2 exceed 45°, it may not be possible to accurately detect whether the moving body is moving in the +X direction or moving in the −X direction when the moving body moves a predetermined distance in the ±X direction from the center C between the first magnet 31 and the second magnet 32.

The first line segment L1 and the second line segment L2 may be line segments positioned substantially symmetrically (linear symmetry) with respect to the second axis AX2 passing through a center point P1 in the X direction of the first magnet 31 and the second magnet 32 or may be line segments positioned asymmetrically with respect to the second axis AX2. That is, the inclination angle θ1 and the inclination angle θ2 may be substantially the same or may differ. When the inclination angle θ1 and the inclination angle θ2 are substantially the same, a range in which the movement amount (absolute value) of the moving body in the +X direction from a predetermined reference position (a position where the movement amount of the moving body can be set to 0 mm) and movement amount (absolute value) of the moving body in the —X direction from the reference position are substantially the same can be set as the detectable range S2. On the other hand, if the inclination angle θ1 and the inclination angle θ2 are different, a range in which the movement amount (absolute value) of the moving body in the +X direction and the movement amount (absolute value) of the moving body in the —X direction are different can be set as the detectable range S2. The magnetic sensor device 1 in which the inclination angle θ1 and the inclination angle θ2 are substantially the same and the magnetic sensor device 1 in which the two are different can be used properly depending on the relationship between the installation position of the magnetic sensor device 1 and the movable space of the moving body, and the like, in applications in which the magnetic sensor device 1 is used. The inclination angle θ1 and the inclination angle θ2 being substantially the same means that the difference between the two is 5° or less.

When the inclination angle θ1 and the inclination angle θ2 are different, the difference between the inclination angle θ1 and the inclination angle θ2 is preferably 90° or less.

Figure 4:
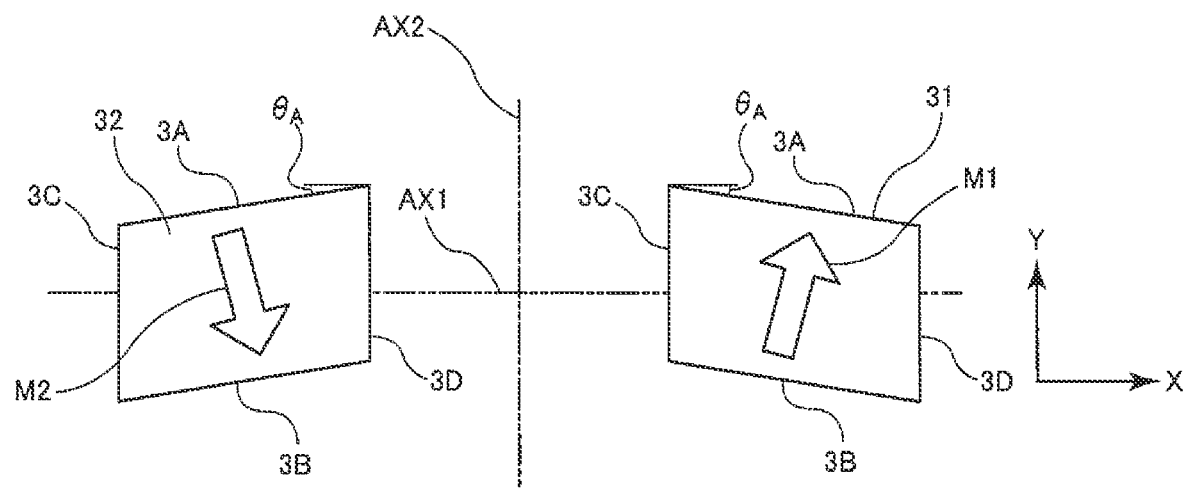
FIG. 4 is a plan view showing a schematic configuration of another aspect of the magnetic field generation unit in an embodiment of the present invention.
Figure 5:
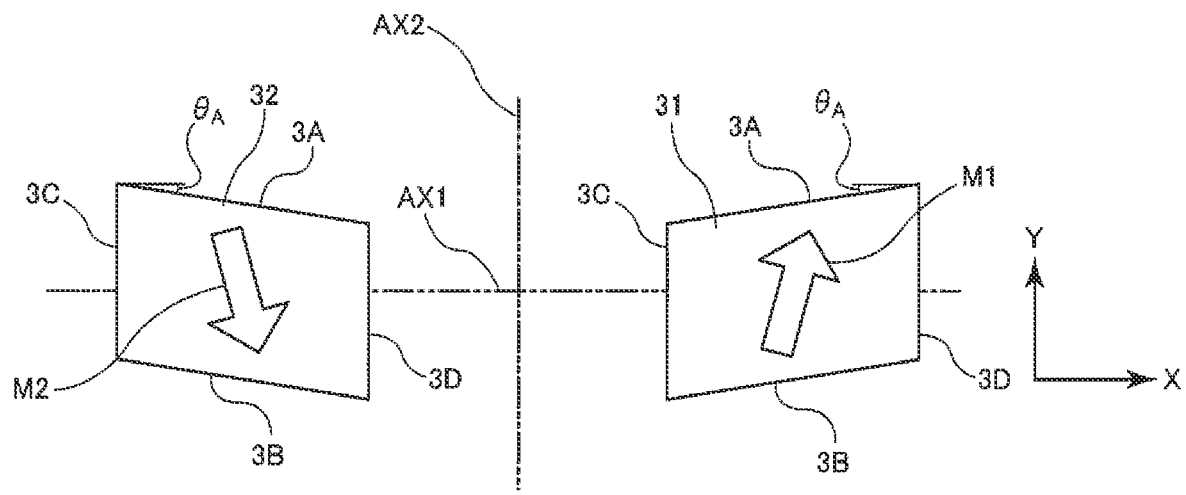
FIG. 5 is a plan view showing a schematic configuration of another aspect of the magnetic field generation unit in an embodiment of the present invention.

The plan view shapes of the first magnet 31 and the second magnet 32 are not limited to a substantially rectangular shape, and may be, for example, parallelogram shapes as shown in FIG. 4 and FIG. 5, and or may be trapezoidal shapes as shown in FIG. 6A, FIG. 6B, FIG. 7A and FIG. 7B.

When the plan view shapes of the first magnet 31 and the second magnet 32 are parallelogram shapes, as shown in FIG. 4 and FIG. 5, the plan view shape is inclined at a predetermined angle θA with respect to the first axis AX1, and can have a first side 3A and a second side 3B, which are parallel to each other, and a third side 3C and a fourth side 3D, which are substantially parallel to the second axis AX2. The first side 3A of the first magnet 31 and the first side 3A of the second magnet 32 may be inclined so that the perpendicular to each first side 3A is open to the magnetic sensor 2 side (+Y side) or may be inclined to open to the opposite side (—Y side) of the magnetic sensor 2. By having the perpendiculars for each of the first side 3A of the first magnet 31 and the first side 3A of the second magnet 32 be inclined to open to the magnetic sensor 2 side (+Y side), it is possible to make the detectable range S2 in the magnetic sensor 2 larger. The inclination angle θA of the first sides 3A of the first magnet 31 and the second magnet 32 is not particularly limited.

Figure 6A:
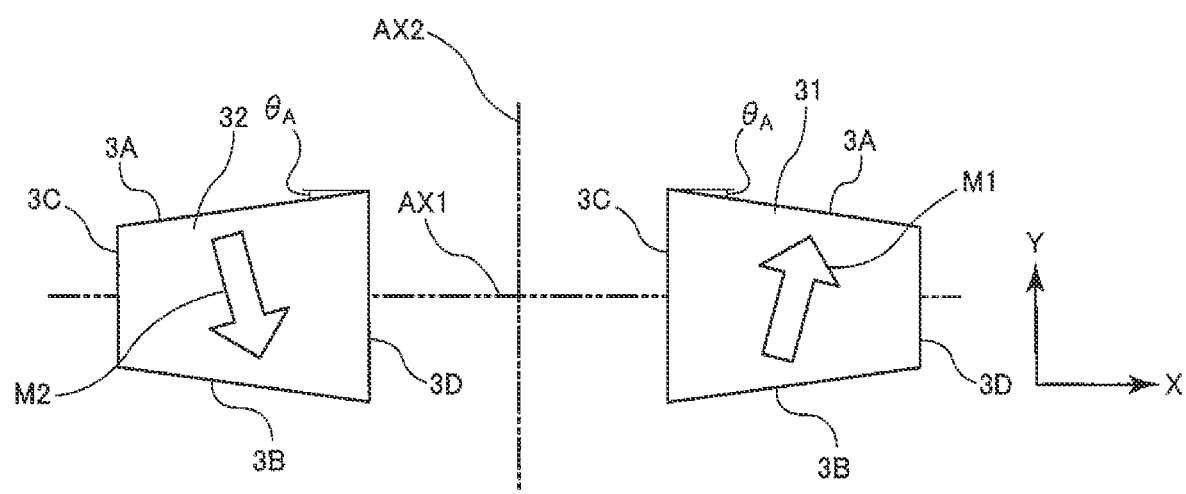
FIG. 6A is a plan view showing a schematic configuration of another aspect of the magnetic field generation unit in an embodiment of the present invention.
Figure 6B:
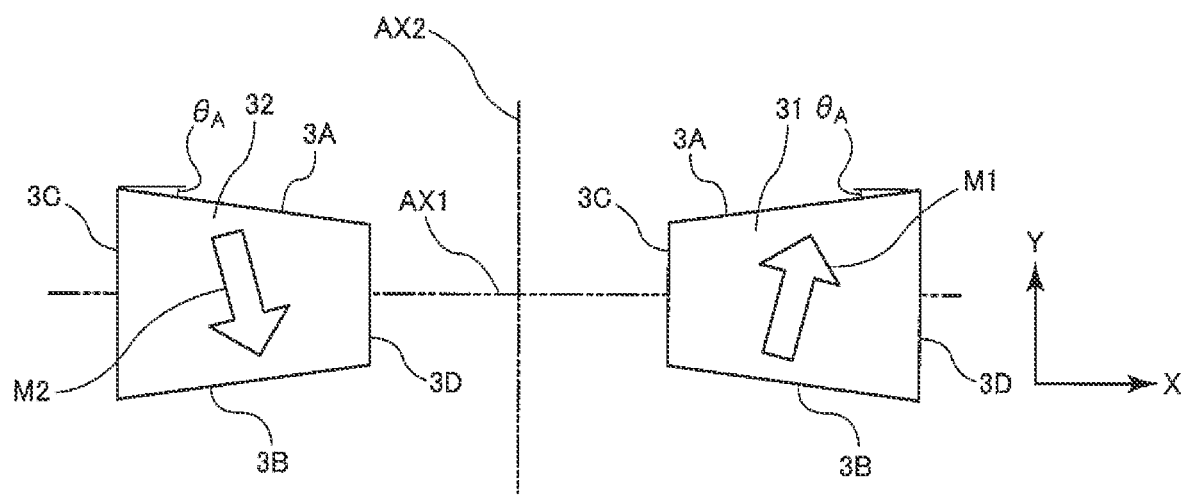
FIG. 6B is a plan view showing a schematic configuration of another aspect of the magnetic field generation unit in an embodiment of the present invention.
Figure 7A:
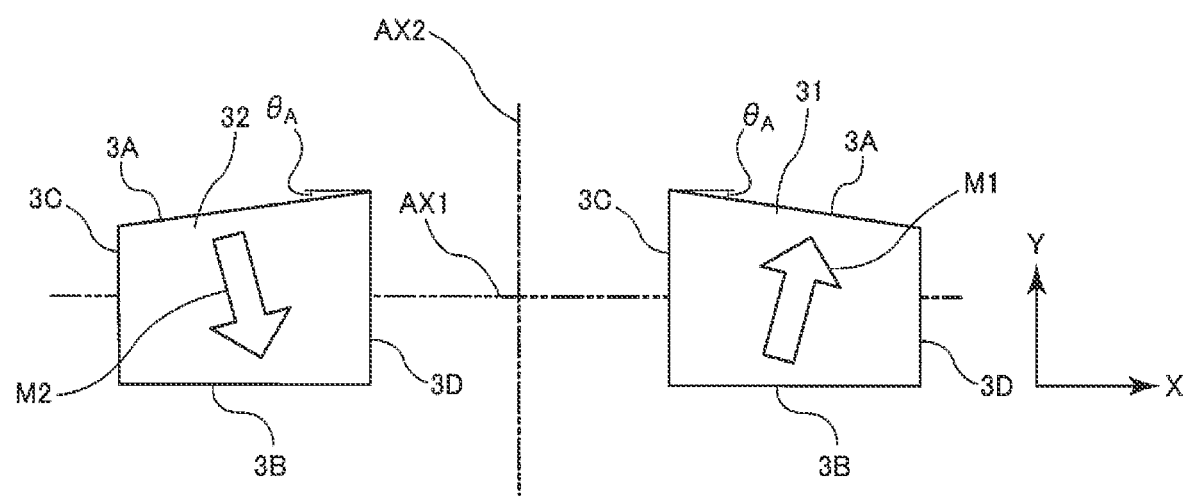
FIG. 7A is a plan view showing a schematic configuration of another aspect of the magnetic field generation unit in an embodiment of the present invention.
Figure 7B:
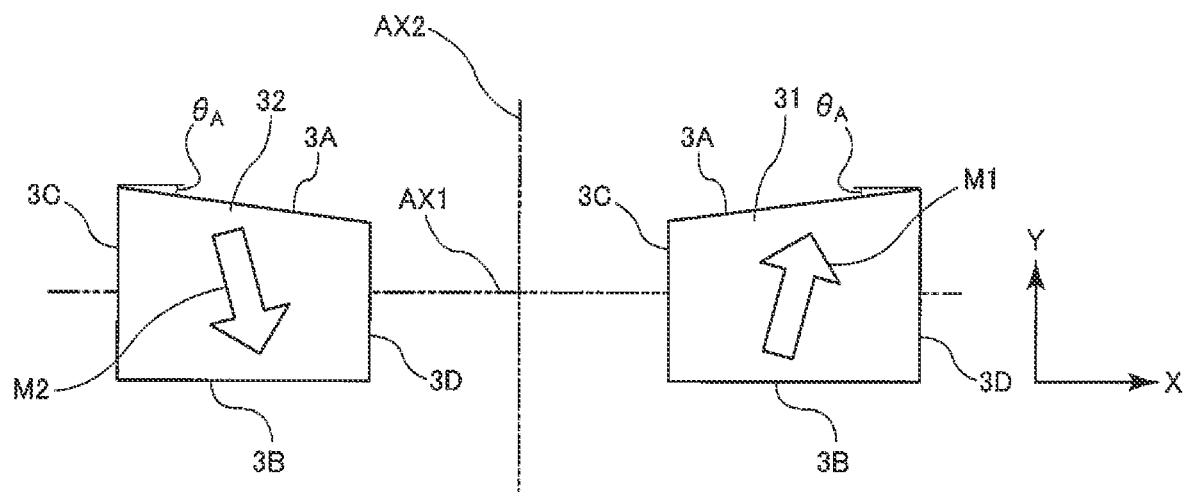
FIG. 7B is a plan view showing a schematic configuration of another aspect of the magnetic field generation unit in an embodiment of the present invention.

When the plan view shapes of the first magnet 31 and the second magnet 32 are trapezoidal shapes, as shown in FIGS. 6A and 6B, the plan view shapes may have a first side 3A and a second side 3B inclined at a predetermined angle θA with respect to the first axis AX1, and a third side 3C and a fourth side 3D substantially parallel to the second axis AX2. Further, as another aspect, as shown in FIGS. 7A and 7B, the above-described plan-view shape may have a first side 3A inclined at a predetermined angle θA with respect to the first axis AX1, a second side 3B substantially parallel to the first axis AZ1, and a third side 3C and a fourth side 3D that are substantially parallel to the second axis AX2. The inclination angle θA of the first sides 3A of the first magnet 31 and the second magnet 32 is not particularly limited.

Figure 8:
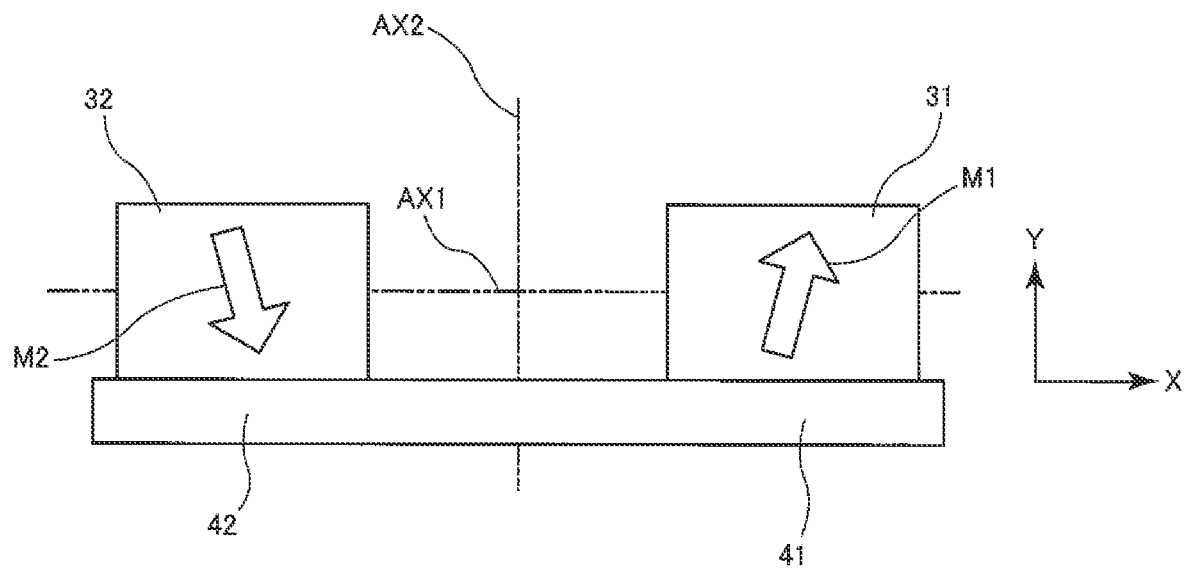
FIG. 8 is a plan view showing a schematic configuration of another aspect of the magnetic field generation unit in an embodiment of the present invention.
Figure 9A:
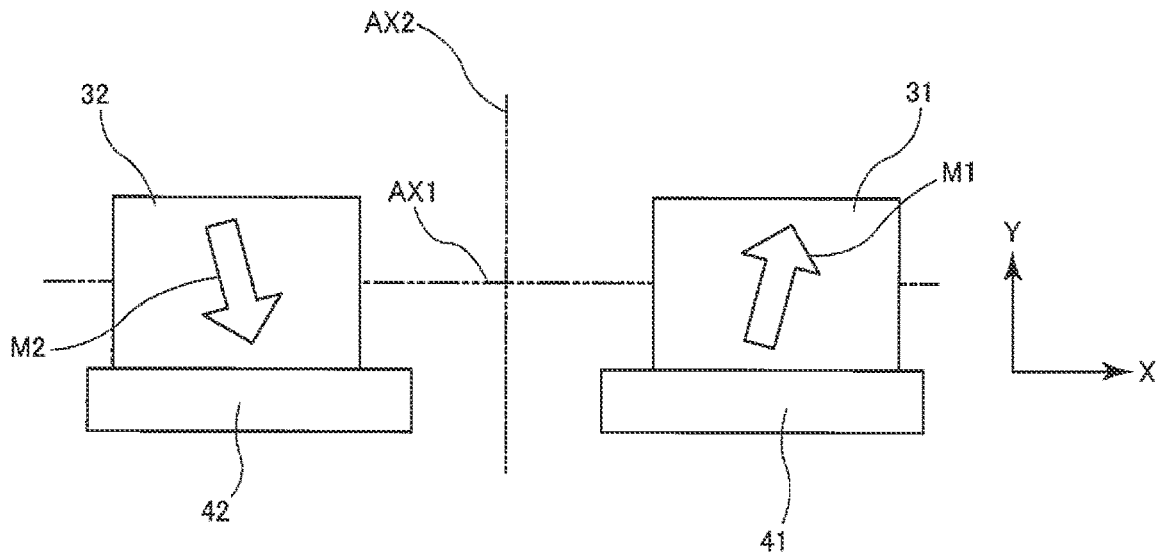
FIG. 9A is a plan view showing a schematic configuration of another aspect of the magnetic field generation unit in an embodiment of the present invention.
Figure 9B:
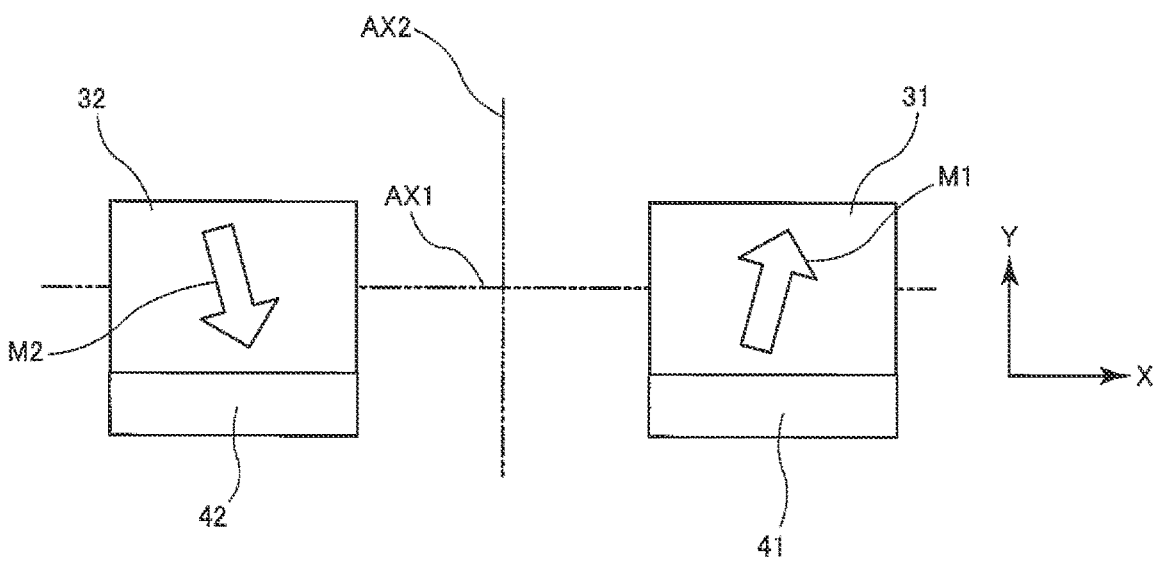
FIG. 9B is a plan view showing a schematic configuration of another aspect of the magnetic field generation unit in an embodiment of the present invention.

As shown in FIG. 8 and FIG. 9, the first magnet 31 in the present embodiment may have a first yoke unit 41 provided on the S pole side (—Y side), and the second magnet 32 may have a second yoke unit 42 provided on the N pole side (—Y side). The first yoke unit 41 and the second yoke unit 42 are made of a magnetic material such as NiFe or the like. The first yoke unit 41 and the second yoke unit 42 may be a continuous integral body (see FIG. 8) or may be separated by a predetermined distance (see FIG. 9A and FIG. 9B). In an aspect in which the first yoke unit 41 and the second yoke unit 42 are separated by a predetermined distance, the lengths of the first yoke unit 41 and the second yoke unit 42 in the X direction may be longer than the first magnet 31 and the second magnet 32 in the X direction of (see FIG. 9A), or the length of the first yoke unit 41 and the second yoke unit 42 in the X direction may be the same as the length of the first magnet 31 and the second magnet 32 in the X direction) see FIG. 9B). By providing the first yoke unit 41 and the second yoke unit 42 on the —Y side of the first magnet 31 and the second magnet 32, the detectable range S2 of the magnetic sensor 2 can be made larger, and by having the first yoke unit 41 and the second yoke unit 42 continuous with each other, the detectable range S2 can be made even larger.

In the present embodiment, the distance (the length in the X direction) between the first magnet 31 and the second magnet 32 is not particularly limited and may be appropriately set according to the detectable range S2 required in the application or the like in which the magnetic sensor device 1 according to the present embodiment is used, the degree of miniaturization required for the magnetic sensor device 1, or the like, and for example can be around 5~50 mm.

In the present embodiment, a sensing gap G1 which is the distance (length in the Y direction) between the end faces of the first magnet 31 and the second magnet 32 on the magnetic sensor 2 side (+Y side) and the magnetic sensor 2 is not particularly limited and may be appropriately set according to the detectable range S2 required in the application or the like in which the magnetic sensor device 1 according to the present embodiment is used, the degree of miniaturization required for the magnetic sensor device 1, or the like, and for example can be around 3~10 mm.

Figure 10:
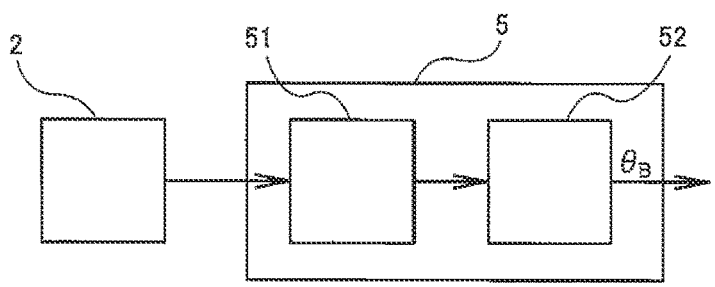
FIG. 10 is a block diagram showing a schematic configuration of a magnetic sensor device according to an embodiment of the present invention.

As shown in FIG. 10, the magnetic sensor device 1 according to the present embodiment includes a signal processing unit 5. The signal processing unit 5 includes an A/D (analog-digital) conversion unit 51 that converts an analog signal output from the magnetic sensor 2 into a digital signal, and a calculation unit 52 that does calculation processing on the digital signal converted to digital by the A/D conversion unit 51. When the calculation processing result processed by the calculation unit 52 is output as an analog signal, the signal processing unit 5 can further include a D/A (digital-analog) conversion unit (undepicted in the drawings) on the downstream side of the calculation unit 52.

The signal processing unit 5 generates a detected value θB generated from the magnetic field generation unit 3 and representing the angle of the direction of the magnetic field impressed on the magnetic sensor 2 with respect to the first axis AX1. The detected value θB has a correspondence relationship with the relative position of the magnetic field generation unit 3 with respect to the magnetic sensor 2.

In the present embodiment, it is necessary to prevent the detected values GB at a plurality of relative positions from becoming the same value. In the present embodiment, the range corresponding to the angle of the detected value GB being at least 0° and less than 360° may be the detectable range S2, or the range of the detected value GB actually generated by the magnetic sensor 2 may be restricted to a narrower range than at least 0° and less than 360° (for example, 5° to 355°), and only the range of relative positions corresponding to this limited range of the detected value GB may be the detectable range S2. As a result, the relative position of the magnetic field generation unit 3 can be uniquely specified by the detected value GB.

In the present embodiment, the magnetic sensor 2 may be, for example, a Hall element, may include one resistance unit, or may include a plurality of resistance units (for example, first to fourth resistance units). When a plurality of resistance units is included, a Wheatstone bridge circuit consisting of a plurality of resistance units (a full-bridge circuit consisting of the first to fourth resistance units or a half-bridge circuit consisting of the first resistance unit and the second resistance unit) may be configured. The resistance units may include a single magnetoresistive effect element (AMR element, GMR element, TMR element, etc.) or may include a plurality of magnetoresistive effect elements.

The A/D conversion unit 51 converts the sensor signal (analog signal related to the current) output from the magnetic sensor 2 into a digital signal, and the digital signal is input to the calculation unit 52. The calculation unit 52 performs calculation processing on the digital signal converted from the analog signal by the A/D conversion unit 51.

The calculation unit 52 is composed of, for example, a microcomputer, an ASIC (Application Specific Integrated Circuit), or the like.

In the present embodiment, when the relative position of the magnetic field generation unit 3 (first magnet 31 and second magnet 32) with respect to the magnetic sensor 2 changes in the ±X direction accompanying movement of the moving body, the direction of the magnetic field impressed on the magnetic sensor 2 changes, and through this, a sensor signal corresponding to the relative position of the magnetic field generation unit 3 (first magnet 31 and second magnet 32) in the ±X direction with respect to the magnetic sensor 2 is output. The detected value GB is generated by the signal processing unit 5 using this sensor signal.

With the magnetic sensor device 1 according to the present embodiment, since the magnetization directions of the first magnet 31 and the second magnet 32 are inclined with respect to the second axis AX2, it is possible to make the detectable range S2 relatively large with respect to the magnetic field generation unit region AR. For example, when the length of the magnetic field generation part region AR along the first axis AX1 is 1, the length along the first axis AX1 of the detectable range S2 can be made 1.5 or less and can be made 1.1~1.5 or less. Accordingly, the size of the magnetic sensor device 1 for detecting a predetermined movement amount can be reduced.

Figure 11:
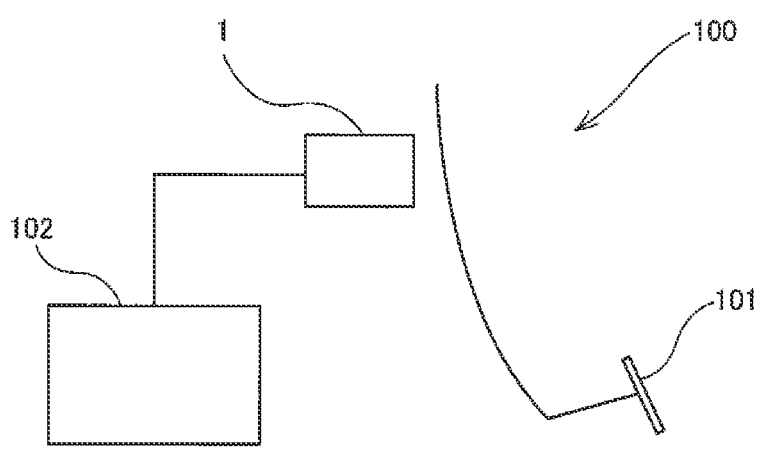
FIG. 11 is a schematic view showing the configuration of a brake pedal operating mechanism in an embodiment of the present invention.

In the above embodiment, the magnetic sensor device 1 can be used for detecting a change in the position of a moving body that moves substantially linearly. The magnetic sensor device 1 according to the present embodiment can be used, for example, as a transmission clutch position detection device, a transmission shift position detection device, or the like, or can be used as a device for detecting the amount of depression of various pedals. For example, as shown in FIG. 11, the magnetic sensor device 1 according to the present embodiment is provided in a brake pedal operating mechanism 100 that includes a pedal 101 such as a vehicle brake pedal and an ECU (Electronic Control Unit) 102, so that the amount of depression of the vehicle brake pedal 101 can be detected. For example, the magnetic sensor device 1 detects the amount of depression of the vehicle brake pedal 101, so that the ECU 102 controls regenerative braking.

The embodiments described above are described for facilitating understanding of the present invention and are not intended to limit the present invention. Therefore, each element disclosed in the above embodiment is intended to include all design changes and equivalents falling within the technical scope of the present invention.

Figure 12:
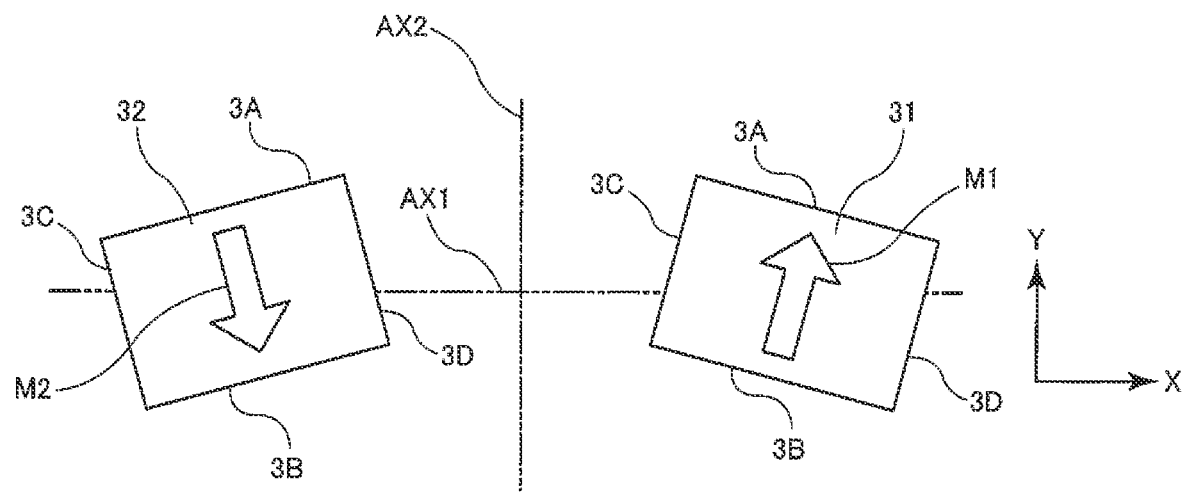
FIG. 12 is a plan view showing a schematic configuration of another aspect of the magnetic field generation unit in an embodiment of the present invention.

In the above embodiment, the first magnet 31 and the second magnet 32, which have the magnetization directions M1 and M2 inclined at predetermined angles θ1 and θ2 with respect to the second axis AX2, are arranged such that the third side 3C and the fourth side 3D are substantially parallel to the second axis AX2. However, the present invention is not limited to this example. For example, as shown in FIG. 12, the first magnet 31 and the second magnet 32, which have the magnetization directions M1 and M2 that are parallel to the third side 3C and the fourth side 3D, may be arranged so that the third side 3C and the fourth side 3D are inclined at predetermined angles θ1 and θ2 with respect to the second axis AX2.

In the above embodiment, an aspect in which the magnetic field generation unit 3 includes two magnets (the first magnet 31 and the second magnet 32) has been described as an example, but this is intended to be illustrative and not limiting. The magnetic field generation unit 3 can include at least two magnets, and for example may include three magnets arranged in parallel along the first axis AX1 (the first magnet 31, a third magnet and the second magnet 32 arranged in order). In this case, when the magnetization directions M1 and M2 of the first magnet 31 and the second magnet 32 are inclined at predetermined angles θ1 and θ2 with respect to the +Y direction, the magnetization direction of the third magnet can be parallel to the —Y direction, and when the magnetization directions M1 and M2 of the first magnet 31 and the second magnet 32 are inclined at predetermined angles θ1 and θ2 with respect to the —Y direction, the magnetization direction of the third magnet can be parallel to the +Y direction.

EXAMPLES

Hereinafter, the present invention will be described in more detail with reference to examples and the like, but the present invention is not limited to the following examples and the like.

Test Example 1

Figure 13:
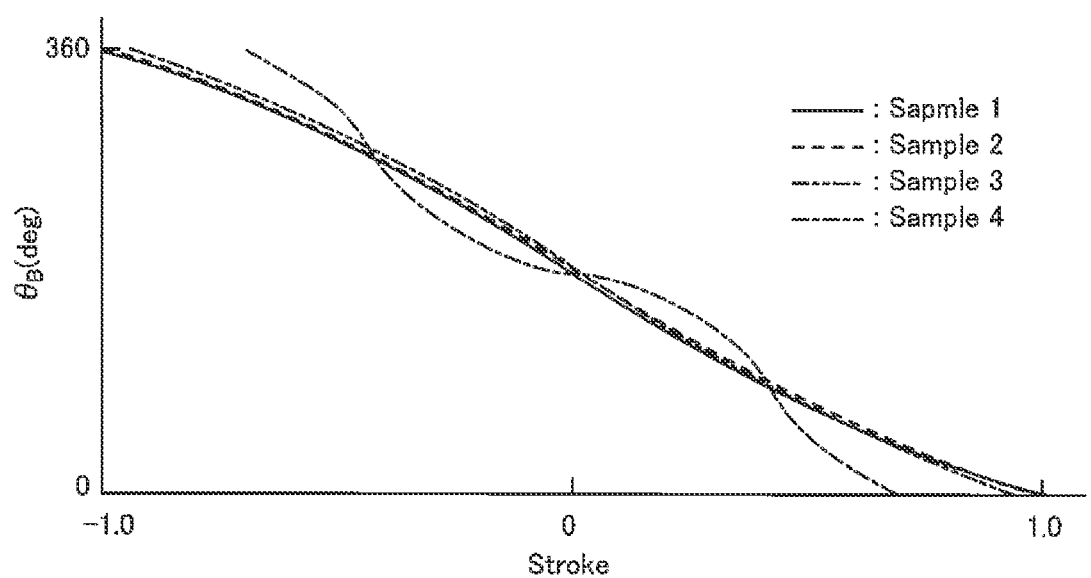
FIG. 13 is a graph showing simulation results for Test Example 1 through Test Example 4.

Using a magnetic sensor device 1 (Sample 1) having the configuration shown in FIG. 1 to FIG. 3, the length of the detectable range S2 in the X direction was found by simulation. In the magnetic sensor device 1, the sizes of the first magnet 31 and the second magnet 32 were a length of 5 mm in the X direction, a length of 3 mm in the Y direction, and a thickness (length in the direction orthogonal to the XY plane) of 5 mm. The inclination angles θ1 and θ2 of the magnetization directions M1 and M2 of the first magnet 31 and the second magnet 32 with respect to the second axis AX2 were each set to 10°. The sensing gap G1 was set to 5 mm. The results are shown in FIG. 13.

Test Example 2

Using a magnetic sensor device 1 (Sample 2) having the same configuration as that of Test Example 1 (Sample 1) except for having the configuration shown in FIG. 12, the length of the detectable range S2 in the X direction was found through simulation the same as in Test Example 1. The results are shown in FIG. 13.

Test Example 3

Using a magnetic sensor device 1 (Sample 3) having the same configuration as that of Test Example 1 (Sample 1) except that the inclination angles θ1 and θ2 of the magnetization directions M1 and M2 of the first magnet 31 and the second magnet 32 with respect to the second axis AX2 were each set to 0°, the length of the detectable range S2 in the X direction was found by simulation in the same manner as in Test Example 1. The results are shown in FIG. 13.

Test Example 4

Using a magnetic sensor device 1 (Sample 4) having the same configuration as that of Test Example 1 (Sample 1) except that the inclination angles θ1 and θ2 of the magnetization directions M1 and M2 of the first magnet 31 and the second magnet 32 with respect to the second axis AX2 were each set to 90°, the length of the detectable range S2 in the X direction was found by simulation in the same manner as in Test Example 1. The results are shown in FIG. 13.

The vertical axis in the graph shown in FIG. 13 is the detected value θB (deg) generated by the magnetic sensor device 1, and the detectable range S2 on the horizontal axis is a standard value of the relative movement amount of the magnetic field generation unit 3 in the ±X direction when the center point P1 of the first magnet 31 and the second magnet 32 in the X direction is set to "0" and the length of the magnetic field generation unit region AR in the X direction is set to "1".

As shown in FIG. 13, the result was that the X-direction lengths of the detectable range S2 in the magnetic sensor devices 1 in the magnetic sensor devices 1 of Sample 1 and Sample 2 are longer than the X-direction lengths of the detectable range S2 in the magnetic sensor devices 1 of Sample 3 and Sample 4. It was found that the magnetic sensor device 1 of Sample 1 can increase the length of the detectable range S2 in the X direction by 13.8% compared to the magnetic sensor device 1 of Sample 3, and the magnetic sensor device 1 of Sample 2 can increase the length of the detectable range S2 in the X direction by 8.1% compared to the magnetic sensor device 1 of Sample 3. From this result, it was confirmed that a longer movement amount can be detected by inclining the magnetization directions M1 and M2 of the first magnet 31 and the second magnet 32 with respect to the second axis AX2. Further, as in Sample 1, by making the third side 3C and the fourth side 3D of the first magnet 31 and the second magnet 32 parallel to the second axis AX2 and inclining the respective magnetization directions M1 and M2 with respect to the second axis AX2, it was confirmed that a range longer than the length of the magnetic field generation region AR in the X direction can be set as the detectable range S2.

Test Example 5

Figure 14:
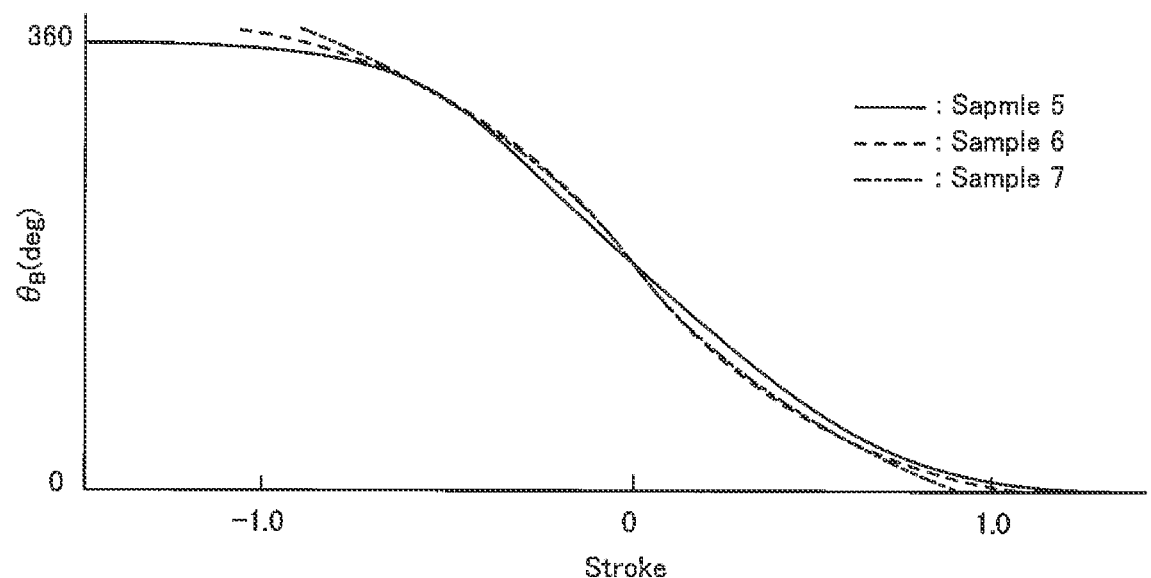
FIG. 14 is a graph showing simulation results for Test Example 5 through Test Example 7.

Using a magnetic sensor device 1 (Sample 5) having the same configuration as that of Test Example 1 (Sample 1) except for having the configuration shown in FIG. 8, the length of the detectable range S2 in the X direction was found through simulation the same as in Test Example 1. The results are shown in FIG. 14.

Test Example 6

Using a magnetic sensor device 1 (Sample 6) having the same configuration as that of Test Example 1 (Sample 1) except for having the configuration shown in FIG. 9A, the length of the detectable range S2 in the X direction was found through simulation the same as in Test Example 1. The results are shown in FIG. 14.

Test Example 7

Using a magnetic sensor device 1 (Sample 7) having the same configuration as that of Test Example 1 (Sample 1) except for having the configuration shown in FIG. 9B, the length of the detectable range S2 in the X direction was found through simulation the same as in Test Example 1. The results are shown in FIG. 14.

The vertical axis in the graph shown in FIG. 14 is the detected value GB (deg) generated by the magnetic sensor device 1, and the detectable range S2 on the horizontal axis is a standard value of the relative movement amount of the magnetic field generation unit 3 in the ±X direction when the center point P1 of the first magnet 31 and the second magnet 32 in the X direction is set to "0" and the length of the magnetic field generation unit region AR in the X direction is set to "1".

From the graph shown in FIG. 14, it was confirmed that by providing the first yoke unit 41 on the S pole side of the first magnet 31 and the second yoke unit 42 on the S pole side of the second magnet 32, the length of the detectable range S2 in the X direction increases. It was found that with the magnetic sensor device 1 of Sample 5, the length of the detectable range S2 in the X direction can be increased by 67.3% compared to the magnetic sensor device 1 of Sample 1, and with the magnetic sensor device 1 of Sample 6, the length of the detectable range S2 in the X direction can be increased by 11.1% compared to the magnetic sensor device 1 of Sample 1. In particular, it was confirmed that by having the first yoke unit 41 and the second yoke unit 42 continuous as in the magnetic sensor device 1 of Sample 5, it is possible to make the length of the detectable range S2 in the X direction extremely long.

Test Example 8

Figure 15:
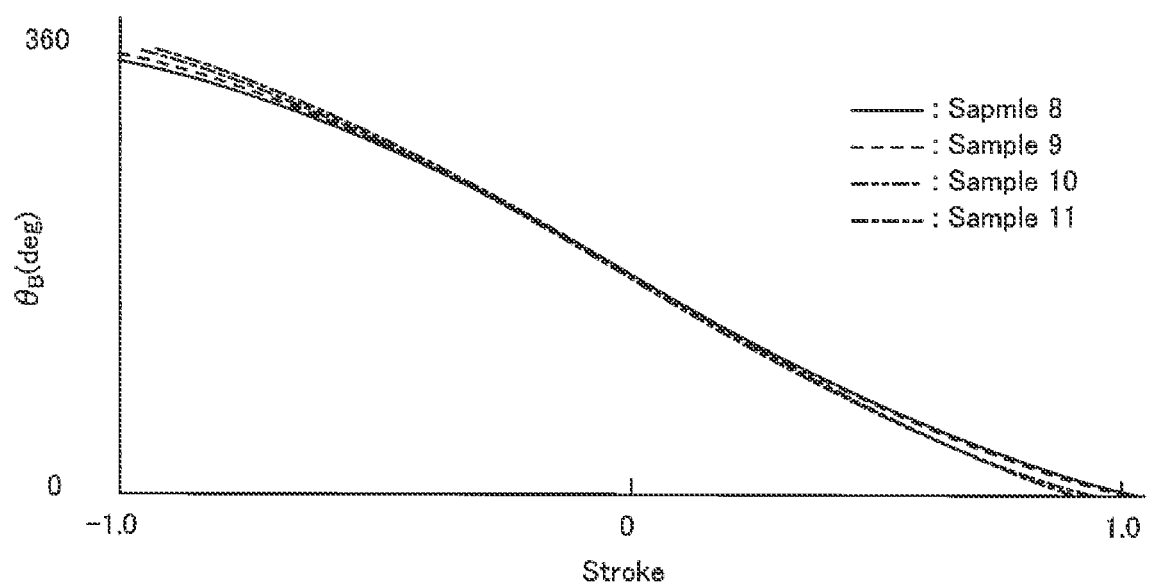
FIG. 15 is a graph showing simulation results for Test Example 8 through Test Example 11.

Using a magnetic sensor device 1 (Sample 8) having the same configuration as that of Test Example 1 (Sample 1) except for having the configuration shown in FIG. 4, the length of the detectable range S2 in the X direction was found through simulation the same as in Test Example 1. The results are shown in FIG. 15.

Test Example 9

Using a magnetic sensor device 1 (Sample 9) having the same configuration as that of Test Example 1 (Sample 1) except for having the configuration shown in FIG. 5, the length of the detectable range S2 in the X direction was found through simulation the same as in Test Example 1. The results are shown in FIG. 15.

Test Example 10

Using a magnetic sensor device 1 (Sample 10) having the same configuration as that of Test Example 8 (Sample 8) except that the inclination angles θ1 and θ2 of the magnetization directions M1 and M2 of the first magnet 31 and the second magnet 32 with respect to the second axis AX2 were set to 0°, the length of the detectable range S2 in the X direction was found by simulation in the same manner as in Test Example 1. The results are shown in FIG. 15.

Test Example 11

Using a magnetic sensor device 1 (Sample 11) having the same configuration as that of Test Example 9 (Sample 9) except that the inclination angles θ1 and θ2 of the magnetization directions M1 and M2 of the first magnet 31 and the second magnet 32 with respect to the second axis AX2 were set to 0°, the length of the detectable range S2 in the X direction was found by simulation in the same manner as in Test Example 1. The results are shown in FIG. 15.

The vertical axis in the graph shown in FIG. 15 is the detected value GB (deg) generated by the magnetic sensor device 1, and the detectable range S2 on the horizontal axis is a standard value of the relative movement amount of the magnetic field generation unit 3 in the ±X direction when the center point P1 of the first magnet 31 and the second magnet 32 in the X direction is set to "0" and the length of the magnetic field generation unit region AR in the X direction is set to "1".

From the graph shown in FIG. 15, it was confirmed that even if the first magnet 31 and the second magnet 32 have parallelogram shapes, by causing the magnetization directions M1 and M2 of each to be inclined at a predetermined angle with respect to the second axis AX2, the length of the detectable range S2 in the X direction increases. It was found that with the magnetic sensor device 1 of Sample 8, the length of the detectable range S2 in the X direction can be increased by 7.9% compared to the magnetic sensor device of Sample 1, and with the magnetic sensor device 1 of Sample 9, the length of the detectable range S2 in the X direction can be increased by 5.5% compared to the magnetic sensor device of Sample 1.

Test Example 12

Figure 16:
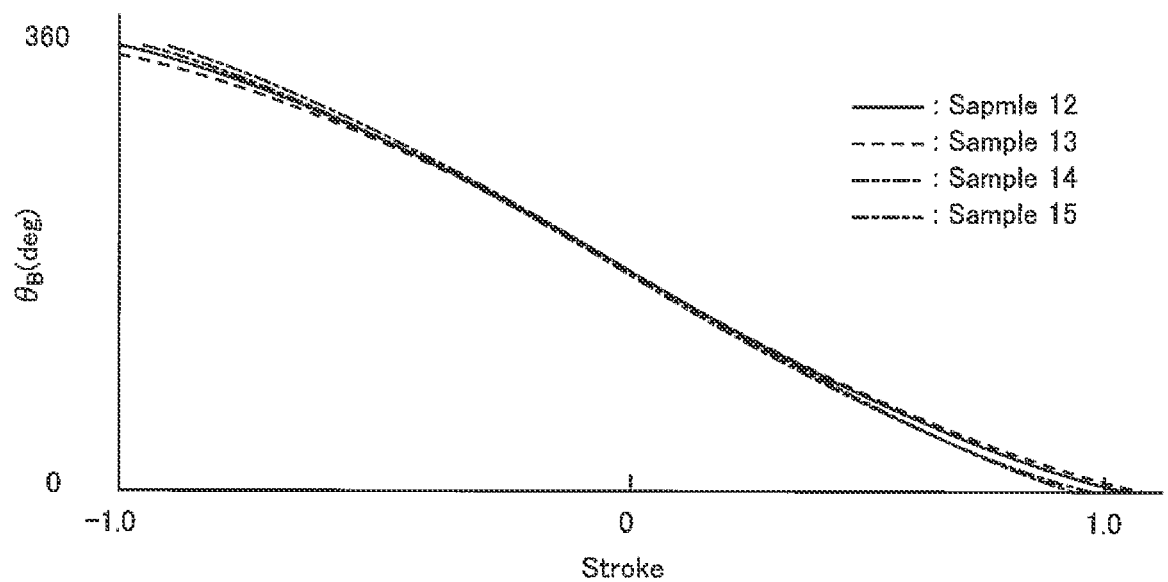
FIG. 16 is a graph showing simulation results for Test Example 12 through Test Example 15.

Using a magnetic sensor device 1 (Sample 12) having the same configuration as that of Test Example 1 (Sample 1) except for having the configuration shown in FIG. 6A, the length of the detectable range S2 in the X direction was found through simulation the same as in Test Example 1. The results are shown in FIG. 16.

Test Example 13

Using a magnetic sensor device 1 (Sample 13) having the same configuration as that of Test Example 1 (Sample 1) except for having the configuration shown in FIG. 6B, the length of the detectable range S2 in the X direction was found through simulation the same as in Test Example 1. The results are shown in FIG. 16.

Test Example 14

Using a magnetic sensor device 1 (Sample 14) having the same configuration as that of Test Example 12 (Sample 12) except that the inclination angles θ1 and θ2 of the magnetization directions M1 and M2 of the first magnet 31 and the second magnet 32 with respect to the second axis AX2 were set to 0°, the length of the detectable range S2 in the X direction was found by simulation in the same manner as in Test Example 1. The results are shown in FIG. 16.

Test Example 15

Using a magnetic sensor device 1 (Sample 15) having the same configuration as that of Test Example 13 (Sample 13) except that the inclination angles θ1 and θ2 of the magnetization directions M1 and M2 of the first magnet 31 and the second magnet 32 with respect to the second axis AX2 were set to 0°, the length of the detectable range S2 in the X direction was found by simulation in the same manner as in Test Example 1. The results are shown in FIG. 16.

Test Example 16

Figure 17:
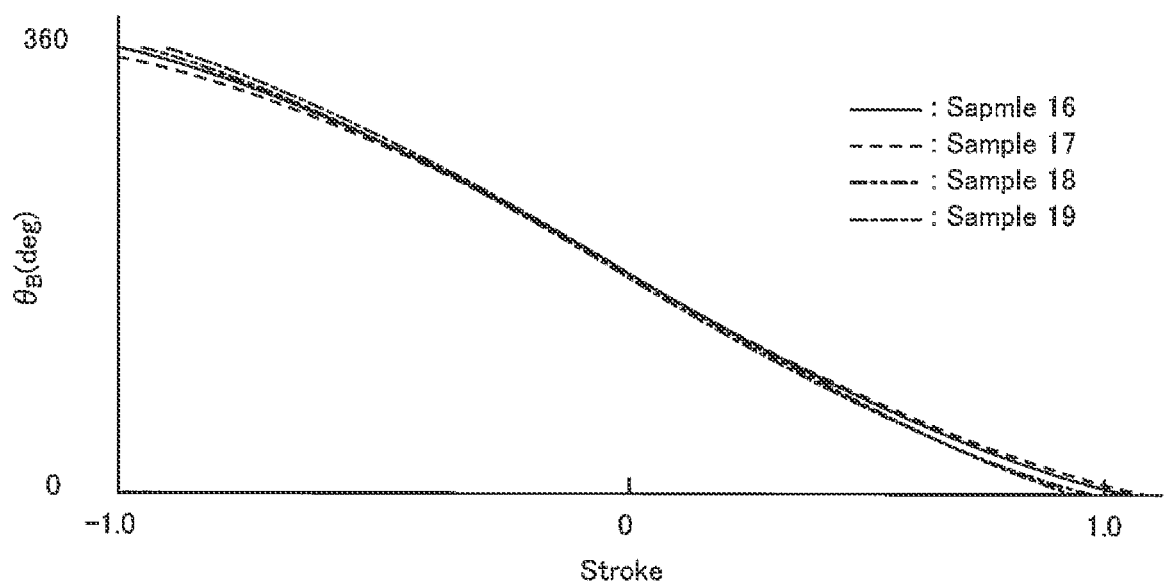
FIG. 17 is a graph showing simulation results for Test Example 16 through Test Example 19.

Using a magnetic sensor device 1 (Sample 16) having the same configuration as that of Test Example 1 (Sample 1) except for having the configuration shown in FIG. 7A, the length of the detectable range S2 in the X direction was found through simulation the same as in Test Example 1. The results are shown in FIG. 17.

Test Example 17

Using a magnetic sensor device 1 (Sample 17) having the same configuration as that of Test Example 1 (Sample 1)

except for having the configuration shown in FIG. 7B, the length of the detectable range S2 in the X direction was found through simulation the same as in Test Example 1. The results are shown in FIG. 17.

Test Example 18

Using a magnetic sensor device 1 (Sample 18) having the same configuration as that of Test Example 16 (Sample 16) except that the inclination angles θ1 and θ2 of the magnetization directions M1 and M2 of the first magnet 31 and the second magnet 32 with respect to the second axis AX2 were set to 0°, the length of the detectable range S2 in the X direction was found by simulation in the same manner as in Test Example 1. The results are shown in FIG. 17.

Test Example 19

Using a magnetic sensor device 1 (Sample 19) having the same configuration as that of Test Example 17 (Sample 17) except that the inclination angles θ1 and θ2 of the magnetization directions M1 and M2 of the first magnet 31 and the second magnet 32 with respect to the second axis AX2 were set to 0°, the length of the detectable range S2 in the X direction was found by simulation in the same manner as in Test Example 1. The results are shown in FIG. 17.

The vertical axis in the graphs shown in FIG. 16 and FIG. 17 is the detected value θB (deg) generated by the magnetic sensor device 1, and the detectable range S2 on the horizontal axis is a standard value of the relative movement amount of the magnetic field generation unit 3 in the ±X direction when the center point P1 of the first magnet 31 and the second magnet 32 in the X direction is set to "0" and the length of the magnetic field generation unit region AR in the X direction is set to "1".

From the graphs shown in FIG. 16 and FIG. 17, it was confirmed that even if the first magnet 31 and the second magnet 32 have trapezoidal shapes, by causing the magnetization directions M1 and M2 of each to be inclined at a predetermined angle with respect to the second axis AX2, the length of the detectable range S2 in the X direction increases. It was found that with the magnetic sensor device 1 of Sample 12, the length of the detectable range S2 in the X direction can be increased by 5.9% compared to the magnetic sensor device 1 of Sample 1; with the magnetic sensor device 1 of Sample 13, the length of the detectable range S2 in the X direction can be increased by 7.3% compared to the magnetic sensor device 1 of Sample 1; and with the magnetic sensor device 1 of Sample 16, the length of the detectable range S2 in the X direction can be increased by 9.8% compared to the magnetic sensor device 1 of Sample 1.

Test Sample 20

Figure 18:
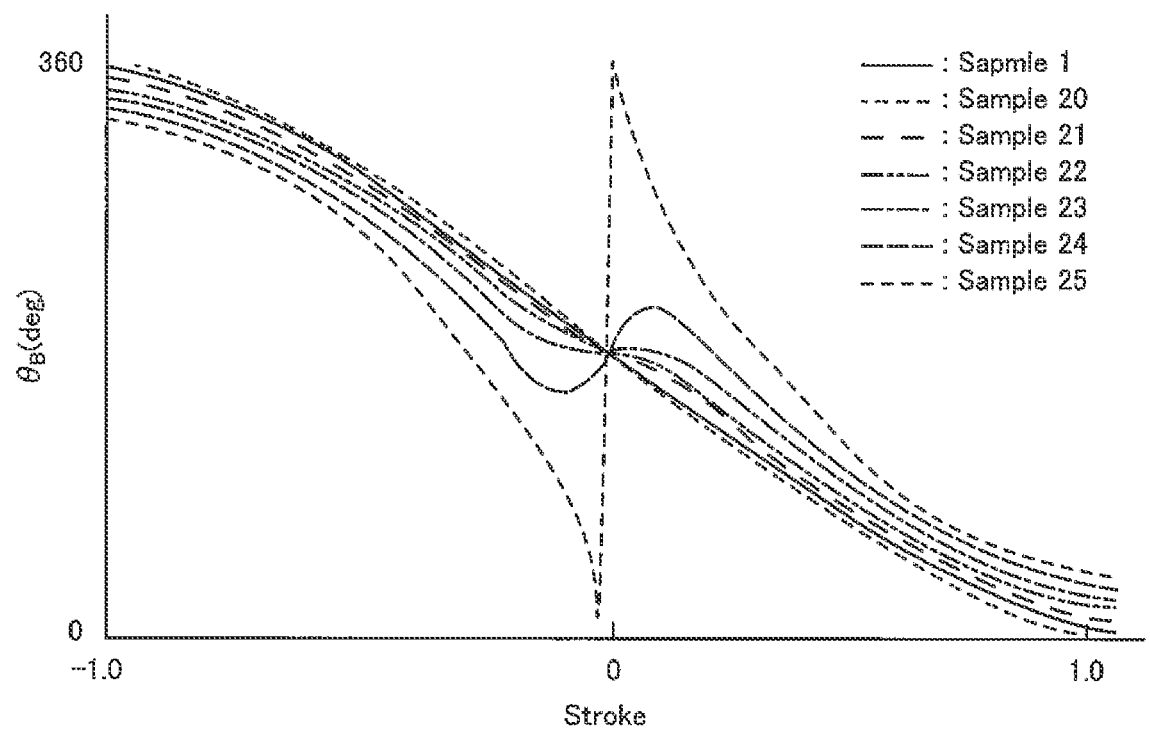
FIG. 18 is a graph showing simulation results for Test Example 20 through Test Example 25.
Figure 19:
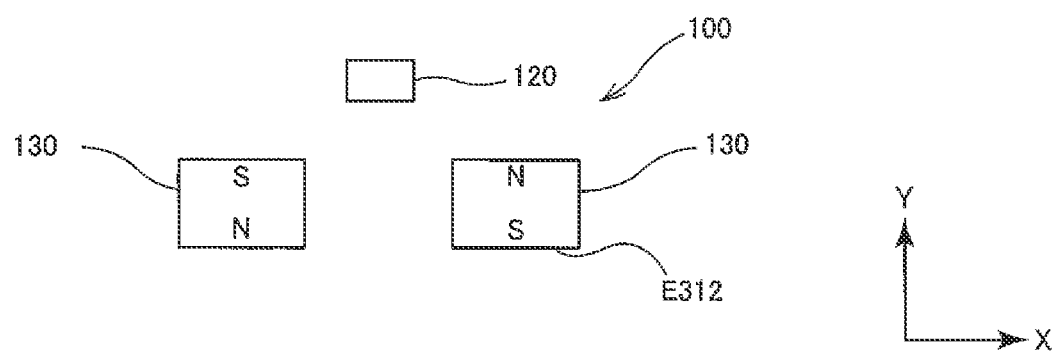
FIG. 19 is a plan view showing a schematic configuration of a conventional magnetic sensor device.

Using a magnetic sensor device 1 (Sample 20) having the same configuration as that of Test Example 1 (Sample 1) except that the inclination angles θ1 and θ2 of the magnetization directions M1 and M2 of the first magnet 31 and the second magnet 32 with respect to the second axis AX2 were set to 5°, the length of the detectable range S2 in the X direction was found by simulation in the same manner as in Test Example 1. The results are shown in FIG. 18.

Test Sample 21

Using a magnetic sensor device 1 (Sample 21) having the same configuration as that of Test Example 1 (Sample 1) except that the inclination angles θ1 and θ2 of the magnetization directions M1 and M2 of the first magnet 31 and the second magnet 32 with respect to the second axis AX2 were set to 20°, the length of the detectable range S2 in the X direction was found by simulation in the same manner as in Test Example 1. The results are shown in FIG. 18.

Test Sample 22

Using a magnetic sensor device 1 (Sample 22) having the same configuration as that of Test Example 1 (Sample 1) except that the inclination angles θ1 and θ2 of the magnetization directions M1 and M2 of the first magnet 31 and the second magnet 32 with respect to the second axis AX2 were set to 30°, the length of the detectable range S2 in the X direction was found by simulation in the same manner as in Test Example 1. The results are shown in FIG. 18.

Test Sample 23

Using a magnetic sensor device 1 (Sample 23) having the same configuration as that of Test Example 1 (Sample 1) except that the inclination angles θ1 and θ2 of the magnetization directions M1 and M2 of the first magnet 31 and the second magnet 32 with respect to the second axis AX2 were set to 45°, the length of the detectable range S2 in the X direction was found by simulation in the same manner as in Test Example 1. The results are shown in FIG. 18.

Test Sample 24

Using a magnetic sensor device 1 (Sample 24) having the same configuration as that of Test Example 1 (Sample 1) except that the inclination angles θ1 and θ2 of the magnetization directions M1 and M2 of the first magnet 31 and the second magnet 32 with respect to the second axis AX2 were set to 60°, the length of the detectable range S2 in the X direction was found by simulation in the same manner as in Test Example 1. The results are shown in FIG. 18.

Test Sample 25

Using a magnetic sensor device 1 (Sample 25) having the same configuration as that of Test Example 1 (Sample 1) except that the inclination angles θ1 and θ2 of the magnetization directions M1 and M2 of the first magnet 31 and the second magnet 32 with respect to the second axis AX2 were set to 75°, the length of the detectable range S2 in the X direction was found by simulation in the same manner as in Test Example 1. The results are shown in FIG. 18.

The vertical axis in the graph shown in FIG. 18 is the detected value θB (deg) generated by the magnetic sensor device 1, and the detectable range S2 on the horizontal axis is a standard value of the relative movement amount of the magnetic field generation unit 3 in the ±X direction when the center point P1 of the first magnet 31 and the second magnet 32 in the X direction is set to "0" and the length of the magnetic field generation unit region AR in the X direction is set to "1".

As shown in FIG. 18, it is conjectured that when the inclination angles θ1 and θ2 of the magnetization directions M1 and M2 of the first magnet 31 and the second magnet 32 exceed 45°, it is difficult to uniquely specify the relative position of the magnetic field generation unit 3 by means of the detected value θB generated by the magnetic sensor device 1.

The invention claimed is:

1. A magnetic sensor device for detecting linear movement of a moving body, the magnetic sensor device comprising a magnetic field generation unit and a magnetic field detection unit provided to be capable of detecting the magnetic field generated by the magnetic field generation unit; wherein
the magnetic field detection unit is provided to be relatively moveable along a first axis accompanying linear movement of the moving body,
the first axis is parallel to the direction of movement of the moving body, the magnetic field generation unit includes a first magnetic field generation unit and a second magnetic field generation unit, the first magnetic field generation unit and the second magnetic field generation unit are arranged substantially parallel to the first axis, a first line segment parallel to a first magnetization direction of the first magnetic field generation unit is inclined with respect to a second axis orthogonal to the first axis, a second line segment parallel to a second magnetization direction of the second magnetic field generation unit is inclined with respect to the second axis, and the first line segment and the second line segment are positioned symmetrically with respect to the second axis and intersect each other to open toward the first axis.

2. The magnetic sensor device according to claim 1, wherein in a plan view, each of the first magnetic field generation unit and the second magnetic field generation unit has an approximately rectangular shape including a first side and a second side, which are opposite each other, and a third side and a fourth side, which are opposite each other, and wherein the first side and the second side are substantially parallel to the first axis, and the third side and the fourth side are substantially parallel to the second axis.

3. The magnetic sensor device according to claim 1, wherein in a plan view, each of the first magnetic field generation unit and the second magnetic field generation unit has a quadrangular shape including a first side and a second side, which are opposite each other, and a third side and a fourth side, which are opposite each other, wherein at least one of the first side and the second side is inclined with respect to the first axis, and the third side and the fourth side are substantially parallel to the second axis.

4. The magnetic sensor device according to claim 3, wherein the quadrangular shape is a parallelogram shape or a trapezoidal shape.

5. The magnetic sensor device according to claim 1, wherein the first line segment and the second line segment are inclined at an angle of 45° or less with respect to the second axis.

6. The magnetic sensor device according to claim 1, wherein the inclination angle of the first line segment with respect to the second axis and the inclination angle of the second line segment with respect to the second axis are substantially the same.

7. The magnetic sensor device according to claim 1, further comprising a first yoke unit connected to the first magnetic field generation unit and a second yoke unit connected to the second magnetic field generation unit.

8. The magnetic sensor device according to claim 7, wherein the first yoke unit and the second yoke unit are connected to each other.

9. The magnetic sensor device according to claim 1, wherein the magnetic field detection unit includes a magnetic field detection element.

10. The magnetic sensor device according to claim 9, wherein the magnetic field detection element is a magnetoresistive effect element.

11. A pedal operating mechanism provided with the magnetic sensor device according to claim 1.

* * * * *